(12) United States Patent
Liu et al.

(10) Patent No.: US 9,673,385 B1
(45) Date of Patent: Jun. 6, 2017

(54) SEED LAYER FOR GROWTH OF <111> MAGNETIC MATERIALS

(71) Applicant: Headway Technologies, Inc., Milpitas, CA (US)

(72) Inventors: Huanlong Liu, Sunnyvale, CA (US); Ru-Ying Tong, Los Gatos, CA (US); Guenole Jan, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/079,463

(22) Filed: Mar. 24, 2016

(51) Int. Cl.
*H01L 43/02* (2006.01)
*H01L 43/10* (2006.01)
*H01L 43/08* (2006.01)
*H01L 43/12* (2006.01)

(52) U.S. Cl.
CPC .............. *H01L 43/02* (2013.01); *H01L 43/08* (2013.01); *H01L 43/10* (2013.01); *H01L 43/12* (2013.01)

(58) Field of Classification Search
CPC ......... H01L 43/02; H01L 43/10; H01L 43/08; H01L 43/12
See application file for complete search history.

(56) References Cited

U.S. PATENT DOCUMENTS

| 8,541,855 | B2 | 9/2013 | Jan et al. |
| 8,593,862 | B2 | 11/2013 | Ranjan et al. |
| 8,871,365 | B2 | 10/2014 | Wang et al. |
| 8,988,832 | B2 | 3/2015 | McNeill et al. |
| 2009/0251951 | A1 | 10/2009 | Yoshikawa et al. |
| 2015/0311427 | A1* | 10/2015 | Gottwald ............... G11C 11/161 257/421 |
| 2015/0325783 | A1 | 11/2015 | Wang et al. |

OTHER PUBLICATIONS

"Current-driven excitation of magnetic multilayers," Elsevier, by J.C. Slonczewski, Journal of Magnetism and Magnetic Materials 159 (Jun. 1996) L1-L7.
"Microwave Assisted Magnetic Recording," by Jian-Gang Zhu et al., IEEE Transactions on Magnetics, vol. 44, No. 1, Jan. 2008, pp. 125-131.
Bond Dissociation Energies, by Yu-Ran Luo, Feb. 23, 2010, pp. 65-98.
Co-pending U.S. Appl. No. 14/880,385, filed Oct. 12, 2015, "Thermal Assisted Magnetic Recording Spot-Size Converter with Finite Ridge Width," by Matted Steffaroni et al., 46 pgs.

* cited by examiner

*Primary Examiner* — Douglas Menz
(74) *Attorney, Agent, or Firm* — Saile Ackerman LLC; Stephen B. Ackerman (57) ABSTRACT

A seed layer stack with a smooth top surface having a peak to peak roughness of about 0.5 nm over a range of 100 nm is formed by sputter depositing an X layer such as Mo on a Ni layer where the X layer has one or both of a larger bond energy and a greater atomic number than Ni. A $(Ni/X)_m$ laminate is formed and then an uppermost NiCr seed layer is deposited to enhance perpendicular magnetic anisotropy (PMA) in an overlying ferromagnetic layer. A <111> NiCr crystal structure promotes <111> texture in the ferromagnetic layer. X layers serve as a diffusion barrier to Ta migration from a bottom electrode and have good lattice matching with the adjoining Ni layer and uppermost NiCr layer. As a result of the smooth seed layer stack in a magnetic tunnel junction (MTJ), MTJ properties are improved and more reproducible.

25 Claims, 6 Drawing Sheets

| Element X | Element atomic number (Z) | Bond energy $D^o_{298}$ kJ mol$^{-1}$ * |
|---|---|---|
| Cr | 24 | 152 |
| Ni | 28 | 204 |
| Zr | 40 | 298 |
| Nb | 41 | 513 |
| Mo | 42 | 436 |
| Ru | 44 | 193 |
| Rh | 45 | 236 |
| Hf | 72 | 328 |
| W | 74 | 666 |
| Os | 76 | 415 |
| Ir | 77 | 361 |

\* Y.R. Luo, Comprehensive Handbook of Chemical Bond Energies, CRC Press Boca Raton, FL. 2007.

FIG. 12 ns to switch the centered cubic (FCC) multilayers or materials having a <111> crystal structure. Thus, it is important to be able to promote a FCC <111> texture in the reference layer in order to attain the best magnetic properties. Furthermore, the reference layer should have a uniform film thickness with a smooth top surface to provide uniformity in the overlying tunnel barrier and free layer that will in turn enable a high magnetoresistive (MR) value and more reproducible tunnel barrier properties from one MTJ to the next.

SEED LAYER FOR GROWTH OF <111> MAGNETIC MATERIALS

RELATED PATENT APPLICATIONS

This application is related to the following: U.S. Pat. No. 8,871,365, filing date Nov. 23, 2015, Ser. No. 14/939,232, both assigned to a common assignee and herein incorporated by reference in their entirety.

TECHNICAL FIELD

The present disclosure relates to magnetic tunnel junctions (MTJs) that utilize thin films with perpendicular magnetic anisotropy (PMA), and in particular, to the use of a multilayer stack for the seed layer to increase PMA and thermal stability in an overlying reference layer that is subject to the same spin transfer torque applied to switch the free layer in the MTJ.

BACKGROUND

Magnetoresistive Random Access Memory (MRAM) has a read function based on a tunneling magnetoresistive (TMR) effect in a MTJ stack wherein a tunnel barrier is formed between a free layer and a reference layer. The free layer serves as a sensing layer by switching the direction of its magnetic moment in response to external fields (media field) while the reference layer has a fixed magnetic moment. The electrical resistance through the tunnel barrier (insulator layer) varies with the relative orientation of the free layer moment compared with the reference layer moment and thereby provides an electrical signal that is representative of the magnetic state in the free layer. A spin-transfer torque (STT) MRAM involves a spin polarized current to switch the free layer, and is described by C. Slonczewski in "Current driven excitation of magnetic multilayers", J. Magn. Magn. Mater. V 159, L1-L7 (1996). J.-G. Zhu et al. has described another spintronics device called a spin transfer oscillator (STO) in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry.

MTJ elements wherein one or both of the free layer and reference layer have perpendicular magnetic anisotropy (PMA) are preferred over their counterparts that employ in-plane anisotropy because the former has an advantage in a lower writing current for the same thermal stability, and better scalability for higher packing density which is one of the key challenges for future MRAM applications. For memory applications as in a STT-MRAM, the free layer magnetization direction is expected to be maintained during a read operation and idle, but change to the opposite direction during a write operation if the new information to store differs from its current memory state. The ability to maintain free layer magnetization direction during an idle period is called data retention or thermal stability. Moreover, the reference layer is subject to the same spin polarized current applied to the free layer and must be thermally stable. A higher PMA in the reference layer (and free layer) is associated with improved thermal stability.

In many cases, a CoFeB/MgO interface is used to induce interfacial perpendicular anisotropy and PMA in one or both of a CoFeB reference layer and CoFeB free layer when MgO is the tunnel barrier. Reference layers are often based on face Typically, a seed layer is deposited as an underlayer to promote good crystal growth in an overlying reference layer, and is usually selected to satisfy one or two requirements including low cost, excellent film uniformity, promotion of a <111> crystal structure in the reference layer, and good diffusion resistance to prevent materials such as Ta from the bottom electrode (BE) or an underlayer from migrating to the tunnel barrier and degrading the MTJ performance. An improved seed layer is needed that satisfies all the aforementioned requirements to enhance PMA in the overlying reference layer and enable optimum tunnel barrier function.

SUMMARY

One objective of the present disclosure is to provide a seed layer stack for a magnetic layer in a MTJ that is made of low cost materials, has excellent film uniformity, promotes a <111> crystal structure in the overlying magnetic layer, and has good diffusion resistance to metals such as Ta in the bottom electrode.

A second objective of the present disclosure is to provide a method of forming the seed layer stack that satisfies the first objective.

These objectives are achieved according to one embodiment of the present disclosure by configuring a MTJ stack on a substrate with a seed layer, reference layer (RL), tunnel barrier, and free layer (FL) in a substrate/seed layer/RL/tunnel barrier/FL bottom spin valve configuration. The substrate may be a bottom electrode in a MRAM device, a bottom shield in a read head sensor, or a main pole layer in a STO device. A key feature is the multilayer stack that is selected for the seed layer. In one embodiment, the seed layer is a stack with a lower $(M/NiX)_n$ laminated layer, and an uppermost NiCr layer where M is a high resputtering rate element such as Mg, Al, Si, C, B, Mn, Rb, Zn, and Ti, n is a lamination number from 2 to 20, and X in the NiX alloy is one of Mo, Ru, Nb, Zr, Rh, W, Os, Ir, and Hf.

The M layer has a substantially uneven top surface after sputter deposition. However, when a low resputtering rate NiX layer is deposited on the M layer, the top surface of the M layer, and top surface of the NiX layer become smoother with a peak to peak thickness variation (roughness) v2 of about 0.5 nm over a 100 nm range compared with a value v1 of about 2 nm over a 100 nm range for the M layer top surface before the NiX layer is deposited. As a result, the NiCr seed layer and overlying reference layer also have a reduced peak to peak roughness v2 that improves the TMR ratio of the MTJ. Furthermore, NiCr is selected as the uppermost seed layer or so-called template layer since its FCC <111> crystal structure promotes a <111> texture in the overlying reference layer thereby improving PMA and thermal stability in the reference layer. Although the upper NiX layer may be amorphous as deposited, after annealing the upper NiX layer crystallizes and has excellent lattice matching with the uppermost NiCr layer.

The advantage of the NiX layers is that the X element is a heavier element (higher atomic number) than Cr in NiCr and is thereby believed to be a better diffusion barrier against Ta migration from the bottom electrode than NiCr. Moreover, the X—X bond energy of the X elements is greater than the Cr—Cr bond energy. It follows that the NiX alloy is believed to have a greater bond energy than that of NiCr which means NiX has a lower resputtering rate than NiCr and is expected to provide a smoother top surface on the seed layer stack than if only M/NiCr or laminations thereof were used in the seed layer composition. NiCr is preferred as the uppermost layer in the seed layer stack since NiCr enables a higher PMA in the overlying reference layer than other seed layer materials including $(Ni/X)_m$ laminates.

The reference layer may have a synthetic antiparallel (SyAP) structure having an AP2/Ru/AP1 configuration or the like where the AP2 magnetic layer adjoins a top surface of the seed layer stack while the AP1 magnetic layer adjoins a bottom surface of the tunnel barrier. The AP2 layer may be a laminated stack represented by $(Co/X)_k$ where X is Pt, Pd, Ni, NiCo, Ni/Pt, or NiFe, and k is from 2 to 30. In another aspect, CoFe or CoFeR may replace Co in the laminated stack where R is one of Mo, Mg, Ta, W, or Cr.

In a second embodiment, the seed layer stack is modified to have an optional bottom M layer, a middle layer having a $(Ni/X)_m$ laminated stack, and an upper NiCr layer. The bottom M layer and first Ni layer have a smoothing effect to reduce the peak to peak roughness observed for the M layer top surface as deposited. Also, since X—X has a greater bond energy than Ni—Ni, each of the plurality of Ni/X stacks serves as a "smoothing layer" to further reduce the peak to peak roughness in the first and subsequent Ni layers. Each X layer is advantageously employed to prevent Ta diffusion from the bottom electrode, and has good lattice matching with the FCC <111> crystal structure in Ni and NiCr layers. NiCr is retained as the uppermost seed layer because of its FCC <111> crystal structure that promotes a <111> crystal structure and enhances PMA in the overlying reference layer.

In some embodiments, the reference layer has an AP2/DL1/Ru/DL2/Mo/CoFeB configuration where DL1 and DL2 are dusting layers such as Co that promote RKKY coupling induced by the Ru antiferromagnetic coupling layer. Mo is an amorphous element that crystallizes upon annealing to promote a <110> crystal structure in the overlying CoFeB AP1 layer. As a result, the AP1 layer in turn induces the desired <110> crystal growth in the overlying MgO tunnel barrier.

After all layers in the MTJ are laid down, an anneal process up to 400° C. for 30 minutes may be employed to further improve PMA properties and thereby increase Hc and Hk in the magnetic layers. Thereafter, a conventional process sequence is performed to fabricate a top electrode, top shield, or trailing shield on the MTJ stack.

DETAILED DESCRIPTION

The present disclosure is a seed layer stack that is used to optimize performance in a MTJ by a promoting a <111> crystal structure and enhancing PMA in an overlying ferromagnetic layer that is a reference layer or free layer in memory devices such as MRAM, in spintronic devices such as STT-MRAM, spin torque oscillators (STO), and microwave assisted magnetic recording (MAMR), and in various spin valve designs including those found in read head sensors. The seed layer stack comprises a laminate with a first type of layer containing an element or alloy which is a good diffusion barrier and has a low resputtering rate property, and a second type of layer with a high resputtering rate property to provide a smooth top surface thereon that enables a high degree of film thickness uniformity in overlying layers. The seed layer stack may be used in devices based on bottom spin valve, top spin valve, or dual spin valve designs as appreciated by those skilled in the art. The terms "structure" and "texture" may be used interchangeably when referring to a crystal orientation in a MTJ layer.

Figure 1:
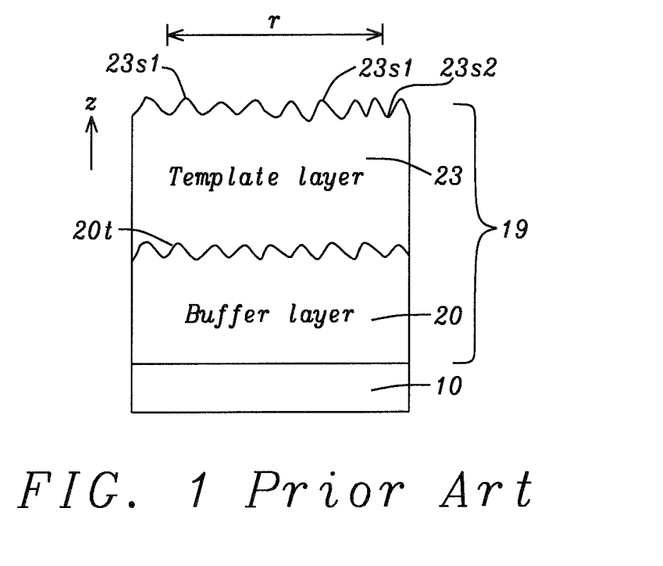
FIG. 1 is a cross-sectional view of a seed layer stack in the prior art where a rough top surface in the bottom layer is reproduced in the upper template layer.

Referring to FIG. 1, a cross-sectional view is shown of a seed layer stack previously fabricated by the inventors. The seed layer 19 is formed on a substrate 10 that may be a bottom electrode in a MRAM device, a bottom shield in a read head sensor, or a main pole layer in a STO device, and has an optional bottom layer called a buffer layer 20 that is used for good adhesion to the substrate. Ta or TaN are commonly selected for the buffer layer, which tends to have considerable roughness at top surface 20t. An upper template layer 23 made of NiCr or NiFeCr is conformally deposited on the buffer layer, and has a <111> crystal structure in order to promote a FCC <111> crystal structure in an overlying magnetic layer (not shown). As a result, there is significant roughness in the top surface of the template layer. In one case, the roughness in top surface 20t is essentially duplicated in the top surface of the template layer where peaks 23s1 are separated by valleys 23s2 in the film because the template layer is deposited conformally. When the buffer layer is absent, a similar roughness in the template layer top surface is realized due to a replication of the roughness in the substrate top surface. The substantial peak to peak roughness in the template layer top surface is associated with a loss in PMA in an overlying magnetic layer that may be a reference layer, free layer, or dipole layer during high temperature processing. For example, if the memory device, spintronics device, or read head sensor is annealed at a temperature range of about 330° C. to 400° C., PMA in the reference layer may degrade because of the rough top surface in the template layer. Peak to peak roughness is defined as the average difference in the z-axis direction between peaks 23s1 and is about 2 nm over a range r of 100 nm.

Previously, we described in related U.S. Pat. No. 8,871,365 how thermal stability in a reference layer and free layer may be improved with a RL1/DL1/Ru/DL2/RL2 or FL1/DL1/Ru/DL2/FL2 configuration, respectively, where R1 and R2 (or FL1 and FL2) are two reference layers or free layers with PMA that are anti-ferromagnetically coupled through a middle Ru layer. Dusting layers (DL1 and DL2) such as Co or CoFe are responsible for enhancing RKKY (Ruderman-Kittel-Kasuya-Yosida) coupling and thermal stability compared with a RL or FL having a R1/Ru/R2, or FL1/Ru/FL2 stack, respectively.

We also disclosed in related application Ser. No. 14/939,232 that forming a seed layer laminate of $(Mg/CoFeB)_n$, for example, provides a reduction in peak to peak roughness at a top surface of the seed layer stack because of the process of depositing a low resputtering rate CoFeB layer on a high resputtering rate Mg layer. Now we have discovered further improvements in the seed layer stack by employing low resputtering rate layers that include other advantages such as diffusion resistance to Ta, and better lattice matching to an uppermost NiCr seed layer.

Figure 2:
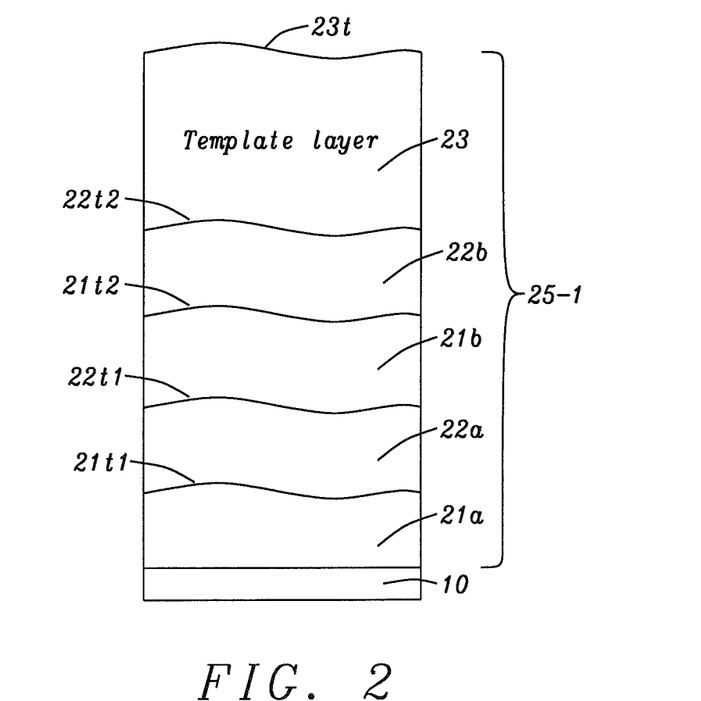
FIG. 2 is a cross-sectional view of the seed layer stack with an uppermost template layer formed according to a first embodiment of the present disclosure.

According to a first embodiment depicted in FIG. 2, the seed layer stack 25-1 of the present disclosure includes a bottom layer comprised of a laminated stack of M and NiX layers, and an uppermost template layer 23 as previously described. In the exemplary embodiment, the laminated stack has a 21a/22a/21b/22b configuration where the M layers 21a, 21b are a high resputtering rate material, and the NiX layers 22a, 22b have a low resputtering rate where X is one of Mo, Ru, Nb, Zr, Rh, W, Os, Ir, and Hf. Each of the M layers is preferably one or more of Mg, Al, Si, C, B, Mn, Rb, Zn, and Ti with a thickness from 3 to 100 Angstroms, and preferably 3 to 20 Angstroms. Each of the NiX layers has a thickness from 1 to 100 Angstroms, and preferably 2 to 15 Angstroms. In some embodiments, depending on the X content in the NiX alloy, the NIX layer is amorphous as deposited and transforms to a <111> crystal structure after a subsequent annealing step. As a result, the upper NiX layer 22b in the seed layer stack has excellent lattice matching with the <111> texture in the NiCr template layer 23.

A key feature is a so-called "smoothing layer" effect where deposition of a low resputtering rate layer on a high resputtering rate layer substantially reduces the peak to peak roughness in the 21a, 21b layers as deposited, and consequently in layers 22a, 22b, and template layer 23 because of conformal deposition on the underlying M layer, or on layer 22b in the case of the template layer. Preferably, each of the M layers has a resputtering rate that is from 2 to 30 times higher than that of a NiX layer.

As defined herein, resputtering rate is related in part to bond energy, which is the energy needed to break apart bonded atoms. Therefore, a material with a low bond energy is easy to resputter and has a higher resputtering rate than a material with a higher bond energy. For example, the bond energy of Mg—Mg is 11.3 kJ/mol while the bond energy of Ni—Ni is 118 kJ/mol, and the bond energies of the X elements vary from 193 kJ/mol for Ru—Ru to 666 kJ/mol for W—W bonds according to a table of values found in "Comprehensive Handbook of Chemical Bond Energies", Y. Luo, CRC Press, Boca Raton, Fla., 2007 and listed in FIG. 12. It is believed that the bond energies of the NiX alloys are generally greater than 200 kJ/mol although only a value is disclosed for NiZr, which is 280 kJ/mol in the Luo reference. Thus, the bond energy ratio between Mg and Ni is about 1:10 to give a resputtering rate for Mg that is about 10 times greater than that for Ni. Moreover, the resputtering rate for Mg is expected to be at least 20 times that for a NiX alloy. According to the table in FIG. 12, the X elements have bond energies about 2 to 6 times that of Ni which means Ni has a resputtering rate about 2 to 6 times greater than one of the X elements. In other words, a Ni/X stack may also serve as a smoothing layer according to a third embodiment in a later section.

A second important factor in determining resputtering rate is the atomic number (Z) of an element. In particular, materials in M layers 21a, 21b are more easily displaced during deposition of a NiX layer 22a, 22b, respectively, when the material for the NiX layer has a higher mass (larger Z value) than the M element because force=mass x acceleration. During sputter deposition, NiX materials with a larger mass (atomic number) strike the top surface of layer 21a (or 21b) with a substantially greater force than material 21a striking the substrate 10, for example, since NiX materials tend to have a larger mass than in the preferred M layer materials such as Mg. Accordingly, a greater resputtering rate ratio (M layer/NiX layer) is achieved with a condition where an M layer is an element or alloy with both of a lower Z value and substantially smaller bond energy than the material in the overlying NiX layer.

Figure 4A:
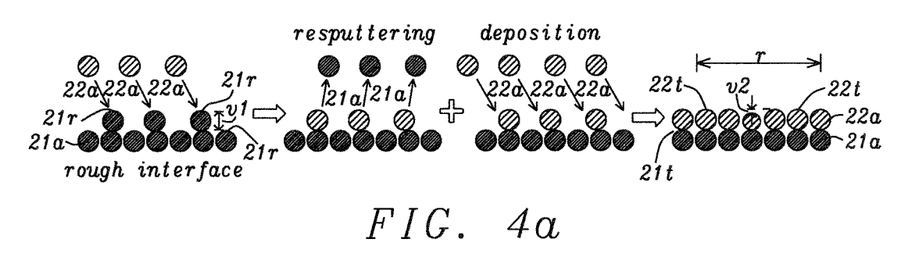
FIGS. 4a-4b depict a process of sputter depositing a low resputtering rate seed layer on a seed layer with a substantially higher resputtering rate according to embodiments of the present disclosure.

As a result of the resputtering rate (bond energy) difference, when the NiX layer 22a is deposited as depicted in the deposition sequence found in FIG. 4a, M atoms are displaced from a top surface of the seed layer 21a and are replaced by a more uniform film of NiX layer 22a. A similar smoothing effect occurs when NiX layer 22b is deposited on M layer 21b. In other words, an "as deposited" top surface 21r of M layer 21a with a peak to peak roughness v1 becomes a smoother top surface 21t with substantially less roughness as NiX layer 22a is deposited thereon. Peak to peak roughness v2 between peaks 22t after deposition of layer 22a is about 0.5 nm over a 100 nm range r, and is substantially less than a peak to peak roughness v1 of about 2 nm over a 100 nm range for top surface 21r prior to deposition of layer 22a.

Returning to FIG. 2, top surfaces 21t1, 21t2 of layers 21a and 21b, respectively are shown with a relatively smooth profile compared with the uneven (rough) top surface 20t of the bottom seed layer 20 in FIG. 1. Likewise, top surfaces 22t1 and 22t2 of layers 22a, 22b, respectively, have a similar peak to peak roughness v2 because of the smoothing effect of sputter depositing a NiX layer on a M layer. Furthermore, the smooth top surface 22t2 is essentially reproduced in top surface 23t of the uppermost template layer 23 that typically conforms to the top surface of the underlying seed layer. As stated previously, the term "smooth" when referring to a top surface 23t may be described in terms of a peak to peak roughness over a range of 100 nm. In this case, a TEM measurement indicates a peak to peak roughness in top surface 23t of about 0.5 nm, which represents a substantial improvement over the 2 nm value for peak to peak roughness for the top surface with peaks 23s1 of the template layer in the FIG. 1 reference.

Figure 3:
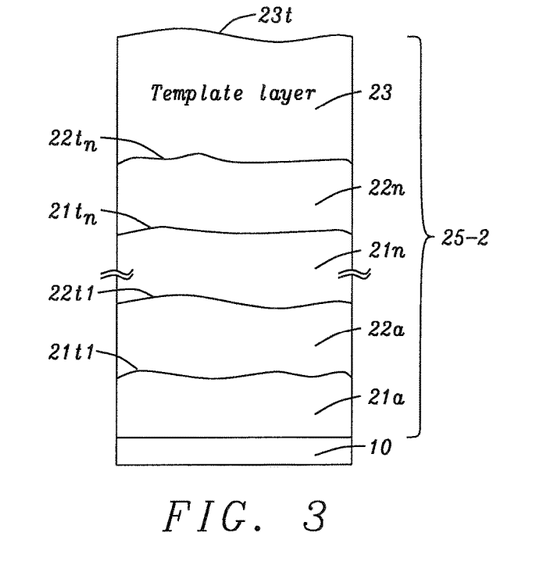
FIG. 3 is a cross-sectional view of the seed layer stack in FIG. 2 wherein the bottom layer is comprised of a plurality of "n" laminates.

In a second embodiment illustrated in FIG. 3, seed layer stack 25-1 from FIG. 2 is modified to a seed layer stack 25-2 that includes a plurality "n" of M and NiX layers formed in alternating fashion where n may be from 3 to 20. Formation of the stack 25-2 involves repeating the deposition process depicted in FIG. 4a a plurality of times where a NiX layer is deposited on an M layer. As a result, top surfaces (21t1 to 21tn) of each M layer 21a to 21n, respectively, and top surfaces 22t1 to 22tn of NiX layers 22a to 22n, respectively, are expected to have a low peak to peak roughness value v2 described earlier. As noted previously, template layer 23 is conformally deposited on the upper NiX layer that is 22n in this example, and thus has a top surface 23t with a peak to peak roughness v2 that is attributed to maintaining PMA in an overlying magnetic layer after processing at temperatures as high as 400° C.

In both of the aforementioned embodiments involving a (M/NiX)$_n$ laminate, the NiX layers provide an additional advantage in acting as a diffusion barrier for Ta or TaN that tend to migrate from the bottom electrode. Again, a material or element with a heaver (higher Z number) such as X is believed to be a better Ta blocker than a lighter element (i.e. Cr in NiCr). Accordingly, the (M/NiX)$_n$ laminate provides not only a smoother template layer top surface than NiCr by itself or on a buffer layer (FIG. 1), but is also a better diffusion barrier than NiCr. Thus, the seed layer embodiments described herein enable a combination of better Ta diffusion control, lower peak to peak roughness at the template layer top surface, and retain a NiCr template layer for promoting a <111> crystal texture and maximum enhancement of PMA in the overlying reference layer that is not achieved in the prior art.

Figure 5:
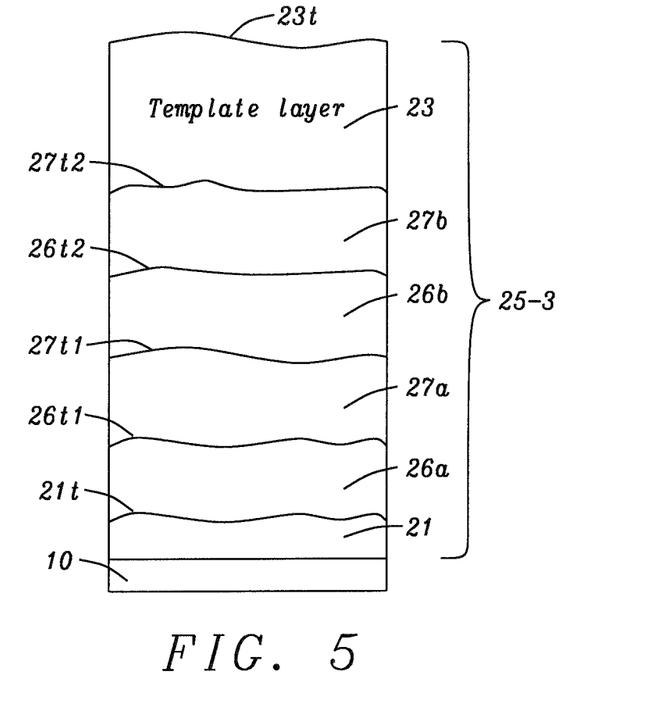
FIG. 5 is a cross-sectional view of a seed layer structure with an uppermost template layer formed on a laminated stack according to a second embodiment of the present disclosure.

According to a third embodiment of the present disclosure depicted in FIG. 5, a seed layer stack 25-3 has an optional bottom M layer 21, a middle laminated (Ni/X)$_m$ layer comprised of alternating Ni layers 26a, 26b, and X layers 27a, 27b, and an uppermost template layer 23 to give a M/(Ni/X)$_2$/NiCr or (Ni/X)$_2$/NiCr configuration, for example, when m=2. In other embodiments, m may be from 3 to 20. A first smoothing effect is realized by depositing a low resputtering rate Ni layer on the M layer similar to a NiX layer deposited on a M layer described previously.

Figure 4B:
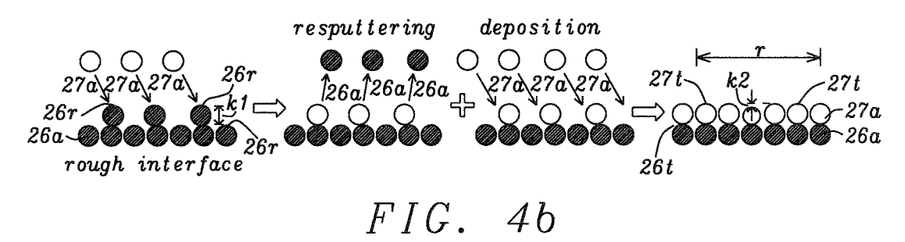
Figure 12:
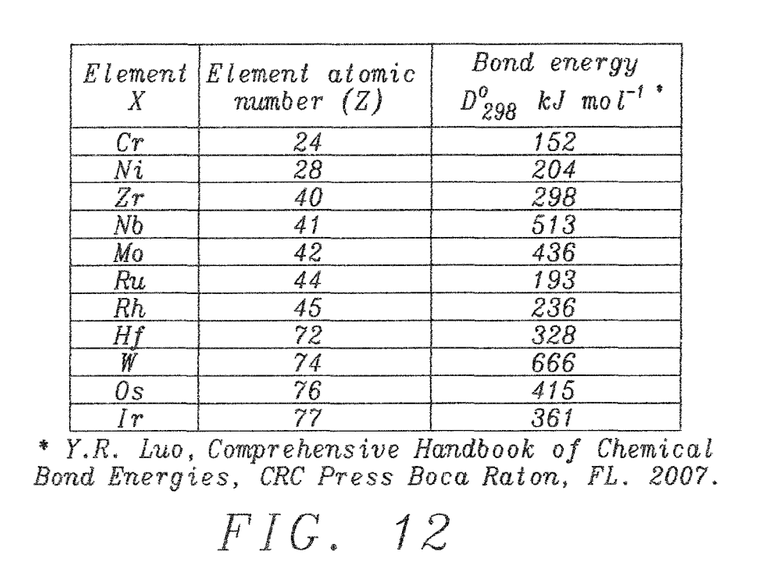
FIG. 12 is a table showing the atomic number and bond energies for several transition metal elements.

As depicted in the process sequence shown in FIG. 4b, deposition of an X layer 27a on a Ni layer 26a is also believed to have an additional smoothing effect because the X material has one or both of a greater bond energy (and thus a lower resputtering rate) and a larger atomic number than Ni when X is one of Mo, Ru, Nb, Zr, Rh, W, Os, Ir, and Hf according to the data shown in FIG. 12. As a result, top surface 23t of a NiCr template layer is expected to have a substantially lower peak to peak roughness than when formed on a buffer layer 20 in FIG. 1, or on substrate 10 without any underlying seed layer having a smoothing effect. In FIG. 4b, a peak to peak roughness k1 on a top surface 26r of layer 26a as deposited is reduced to a peak to peak roughness k2 on top surface 27t after layer 27a is deposited.

Each X layer offers an additional advantage of serving as a diffusion blocker for Ta or TaN, for example, in the substrate. Otherwise, Ta may migrate to the tunnel barrier (not shown) above the seed layer stack 25-3 and degrade the magnetoresistance ratio and RA value. A plurality of Ni/X stacks is expected to be more favorable than a single Ni/X stack in the seed layer because each subsequent Ni/X stack after the first (26a/27a) may provide a slight smoothing effect improvement and therefore an improvement in enhancing PMA and thermal stability in an overlying reference layer or free layer.

Figure 6:
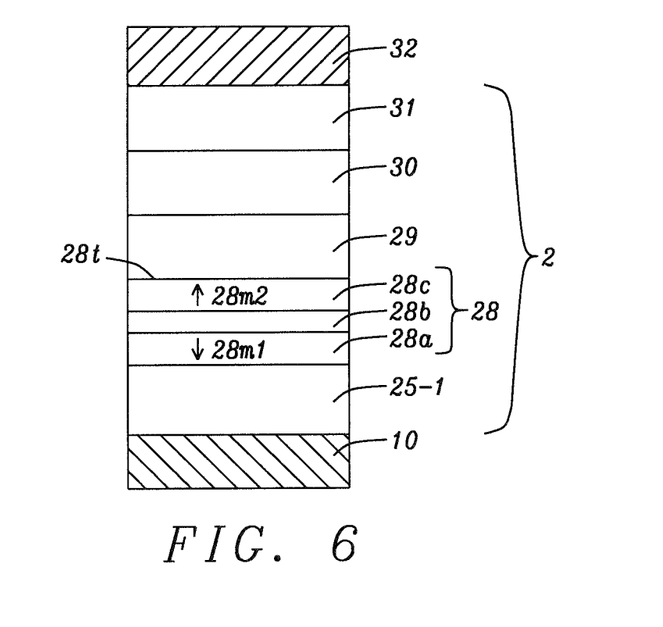
FIG. 6 is a cross-sectional view that illustrates a MTJ wherein a reference layer is disposed on a seed layer stack that is formed according to an embodiment of the present disclosure.

Referring to FIG. 6, the present disclosure also encompasses a MTJ 2 that includes a previously disclosed seed layer stack 25-1 on substrate 10. In alternative embodiments, seed layer stack 25-2 or 25-3 may be substituted for stack 25-1. According to the exemplary embodiment with a bottom spin valve configuration, a reference layer 28, tunnel barrier 29, free layer 30, and cap layer 31 are sequentially formed on the seed layer stack. The reference layer may have a synthetic anti-parallel (SyAP) structure where a coupling layer 28b such as Ru is placed between a lower AP2 magnetic layer 28a and an upper AP1 magnetic layer 28c. Note that the AP2 and AP1 layers have perpendicular magnetic anisotropy indicated by arrows 28m1, 28m2, respectively, that are oriented perpendicular to the planes of the layers. As mentioned earlier, stack 25-1 enhances PMA 28m1 with a smooth top surface and a <111> crystal structure in the template layer that matches the <111> texture in the AP2 layer. Moreover, the reference layer has a smooth top surface 28t1 that enables a uniformly thick tunnel barrier to be formed. A top electrode 32 is formed on cap layer 31 when MTJ 2 is a memory device. Layer 32 may also be a top shield in a read head, or a trailing shield in a STO device.

PMA in each of the AP2 and AP1 layers may be intrinsic and derived from a laminated stack (Co/X)$_k$ or (X/Co)$_k$ where X is Pt, Pd, Ni, NiCo, Ni/Pt, or NiFe, and k is from 2 to 30. In another aspect, CoFe or CoFeR may replace Co in the laminated stack and R is one of Mo, Mg, Ta, W, or Cr. The present disclosure also anticipates that the AP1 layer 28c may be one or more of CoFeB, CoFe, CoB, FeB, and Co and PMA 28m2 is induced therein by forming an interface with an oxide layer in the tunnel barrier 29.

Figure 9:
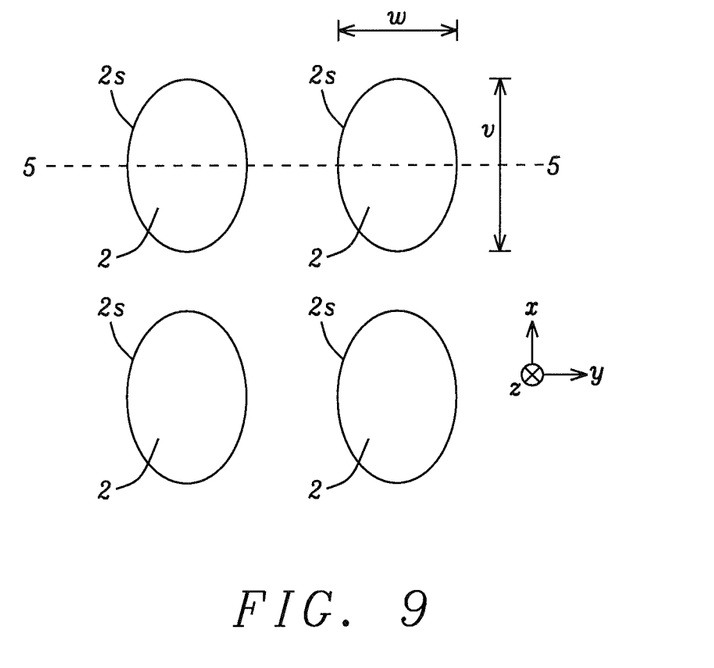
FIG. 9 is a top-down view of the MTJ structure in FIG. 8.

A tunnel barrier 29 is formed on the reference layer 28. The tunnel barrier is preferably an oxide, nitride, or oxynitride of one or more of Mg, MgZn, Ta, Ti, Zn, Al, or AlTi and typically has a <100> crystal structure. The thickness and extent of oxidation in the metal oxide layer may be adjusted to tune the resistance x area (RA) value for the tunnel barrier. It is believed that the smoothness of the template layer top surface 23t is substantially replicated in the overlying layers in MTJ 2 including the tunnel barrier and thereby enables more reproducible properties including RA value and TMR ratio (dR/R) among a plurality of MTJs on a substrate as depicted in FIG. 9. TMR ratio relates to the change in resistance (dR) when a read current is applied across the MTJ, and the resistance (R) before the read current is applied.

A free layer/capping layer stack is formed on the tunnel barrier. The free layer 30 may be selected from one of the laminated compositions described with respect to the AP2 reference layer. In an alternative embodiment, the free layer may be one or more of Co, Fe, CoFe, and alloys thereof with one or both of Ni and B. In another aspect, a moment diluting layer (D) such as Ta or Mg is inserted in one of the aforementioned metals or alloys to give a CoFeB/D/CoFeB configuration, for example. Furthermore, the free layer (FL) may have a FL1/DL1/Ru/DL2/FL2 configuration where FL1 and FL2 are two magnetic layers or a laminate with PMA as previously described that are antiferromagnetically coupled through a middle Ru layer. DL1 and DL2 are dusting layers as explained earlier.

In some embodiments, the capping layer 31 is a metal oxide such as MgO or MgTaOx to enhance PMA in the free layer by inducing interfacial perpendicular anisotropy along an interface with the free layer. In other embodiments, the capping layer has an uppermost layer that is one or more of Ru and Ta to give a capping layer stack that is Ru/Ta/Ru or MgO/Ru/Ta, for example.

Figure 7:
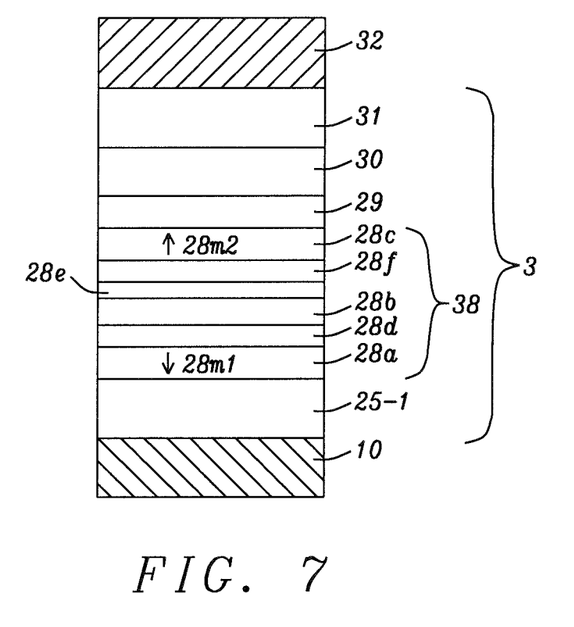
FIG. 7 is a cross-sectional view showing a MTJ wherein a reference layer is formed on a seed layer stack according to another embodiment of the present disclosure.

Referring to FIG. 7, an alternative embodiment is depicted with MTJ 3 which retains the bottom spin valve configuration from MTJ 2 except reference layer 28 is replaced with reference layer 38 having a stack of layers including two dusting layers labeled DL1 28d, and DL2 28e, and an optional transition layer (L) 28f between the AP1 layer 28a and AP2 layer 28c to give a AP2/DL1/Ru/DL2/L/AP1 configuration where L may be Mo. The L layer is preferably amorphous as deposited with a thickness of about 2 to 3 Angstroms, and the AP1 layer may be an amorphous CoFeB layer that crystallizes to a <110> crystal structure after subsequent annealing at a temperature of 330° C. to 400° C. Thus, the L layer enables a transition from a <111> texture in the DL2 28e layer to a <110> texture in the AP1 layer 28c. Each of the dusting layers has a thickness from about 1 to 10 Angstroms, and is preferably made of Co or CoFe.

It should be understood that the present disclosure also encompasses a seed layer stack 25-1, 25-2, or 25-3 in a MTJ with a top spin valve configuration (not shown). According to one embodiment, the layers in FIG. 6 are retained except the positions of reference layer 28 and free layer 30 are switched so that the free layer contacts a top surface of the seed layer stack. As indicated earlier, the free layer may have a SyAP structure where a bottom FL1 layer contacts the seed layer stack, an uppermost FL2 layer contacts the tunnel barrier 29, and a Ru spacer with optional DL1 and DL2 layers are formed to give a FL1/DL1/Ru/DL2/FL2 stack of layers. In this case, template layer 23 in the seed layer stack enhances PMA in the FL1 layer which preferably has a <111> crystal structure and may be a laminate that is $(Co/X)_k$ or the like. The FL2 layer may be one or more of CoFeB, Co, CoB, FeB, and CoFe. Both FL1 and FL2 layers have PMA but their magnetic moments are aligned in opposite directions.

The present disclosure also anticipates a method of forming the seed layer stack in the embodiments disclosed herein. All layers in the MTJ stack including the seed layers may be deposited in a DC sputtering chamber of a sputtering system such as an Anelva C-7100 sputter deposition system or the like that includes ultra high vacuum DC magnetron sputter chambers with multiple targets and at least one oxidation chamber. Typically, the sputter deposition process for the seed layer stack including the high resputtering rate M layer and low resputtering rate NiX, Ni, and X layers involves an inert gas such as Ar and a base pressure between $5 \times 10^{-8}$ and $5 \times 10^{-9}$ torr. A lower pressure enables more uniform films to be deposited. The temperature in the sputter deposition chamber during deposition processes may vary from 100° K. to 400° C., and the forward power applied to one or more targets to form each seed layer is usually in the range of 20 W to 5000 W. When two targets such as Ni and X are in the same chamber, a different forward power may be applied to each target.

The tunnel barrier and metal oxide (when included) for the capping layer are prepared by first depositing a first metal layer, oxidizing the first metal layer with a natural oxidation (NOX) or radical oxidation (ROX) process, and then depositing a second metal layer on the oxidized first metal layer. During a subsequent annealing step, oxygen migrates into the second metal layer to oxidize the second metal. In some embodiments, one or more additional metal layers are deposited in the tunnel barrier stack and each oxidized by a NOX or ROX process before an uppermost metal layer is deposited and then oxidized by way of annealing to generate tunnel barrier 29. Once all of the layers in the MTJ are formed, an annealing process is performed that is comprised of a temperature between 330° C. and 400° C. for a period of 1 minute to 10 hours.

Figure 8:
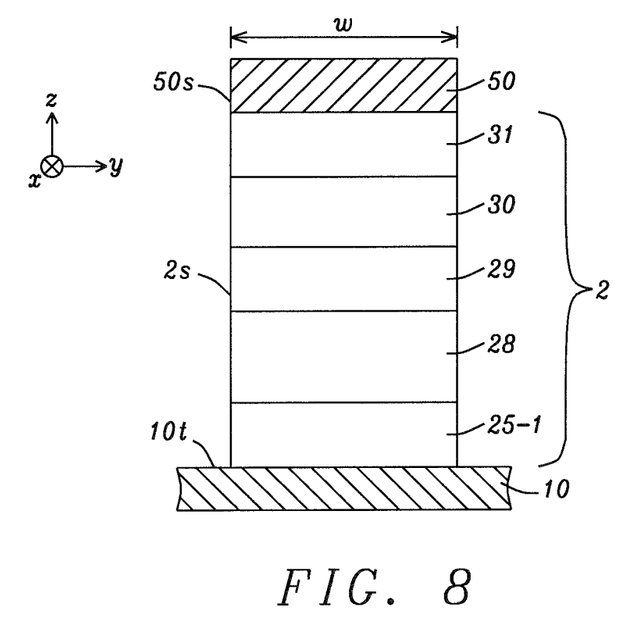
FIGS. 8 and 10 are cross-sectional views of a sequence of steps showing the formation of a MTJ in a magnetic device according to an embodiment of the present disclosure.

Referring to FIG. 8, a photoresist layer is coated and patterned to form a photoresist mask 50 having a width w that defines a width in the y-axis direction of the MTJ 2. An ion beam etch (IBE) or reactive ion etch (RIE) may be used to transfer sidewall 50s through the MTJ stack of layers to form MTJ sidewall 2s that stops on the top surface 10t of the substrate. Although sidewall 2s is shown as essentially vertical, the sidewall may also be sloped such that seed layer 25-1 has a greater width along the y-axis direction than that of cap layer 31.

FIG. 9 shows a top-down view of the etched structure in FIG. 8. Note the cross-sectional view in FIG. 8 is taken along plane 5-5 in FIG. 9. The fabrication sequence involves forming a plurality of MTJs 2 arranged in rows and columns and each having a sidewall 2s that may be elliptical with a y-axis width w and an x-axis length h. In other embodiments, the sidewall shape may be substantially circular. Although only four MTJs are shown in the exemplary embodiment, there are typically thousands or even millions of MTJs formed in an array on substrate 10.

Figure 10:
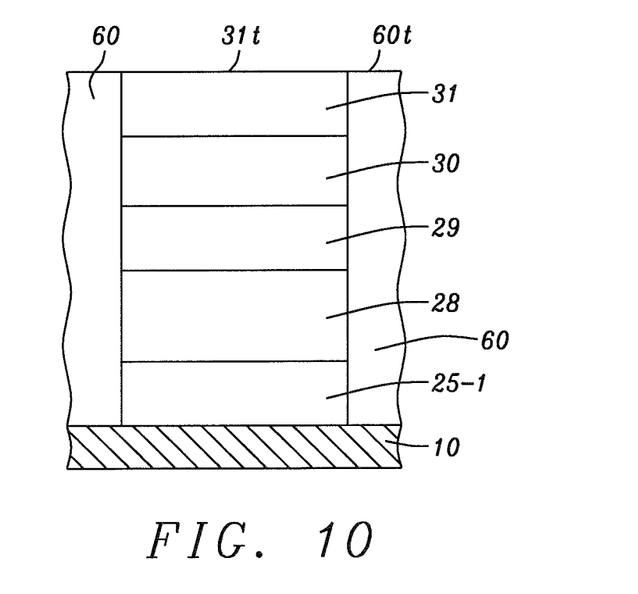

Referring to FIG. 10, a dielectric layer 60 is deposited by a conventional method to fill the space between adjacent sidewalls 2s. Then a chemical mechanical polish (CMP) process is performed to remove the photoresist mask and form a dielectric layer top surface 60t that is coplanar with cap layer top surface 31t. Thereafter, a top electrode 32 (shown in FIG. 6) is formed above each MTJ by a well known method where the top electrode comprises parallel metal lines each having a lengthwise dimension in either the x-axis or y-axis direction as appreciated by those skilled in the art.

TABLE 1

Effect on perpendicular field for various seed layer/reference layer stacks

| Seed layer | Reference layer | Perp. Field (Oe) |
| --- | --- | --- |
| $(Ni5/Ru1.5)_8$ | $(Ni6/Co1.8)_3/Co5/Ru4/Co5/Mo2/CoFeB9$ | 5000 |
| $(Ni5/Mo1)_8$ | $(Ni6/Co1.8)_3/Co5/Ru4/Co5/Mo2/CoFeB9$ | 6000 |
| NiCr 50 | $(Ni6/Co1.8)_3/Co5/Ru4/Co5/Mo2/CoFeB9$ | 8000 |

Figure 11:
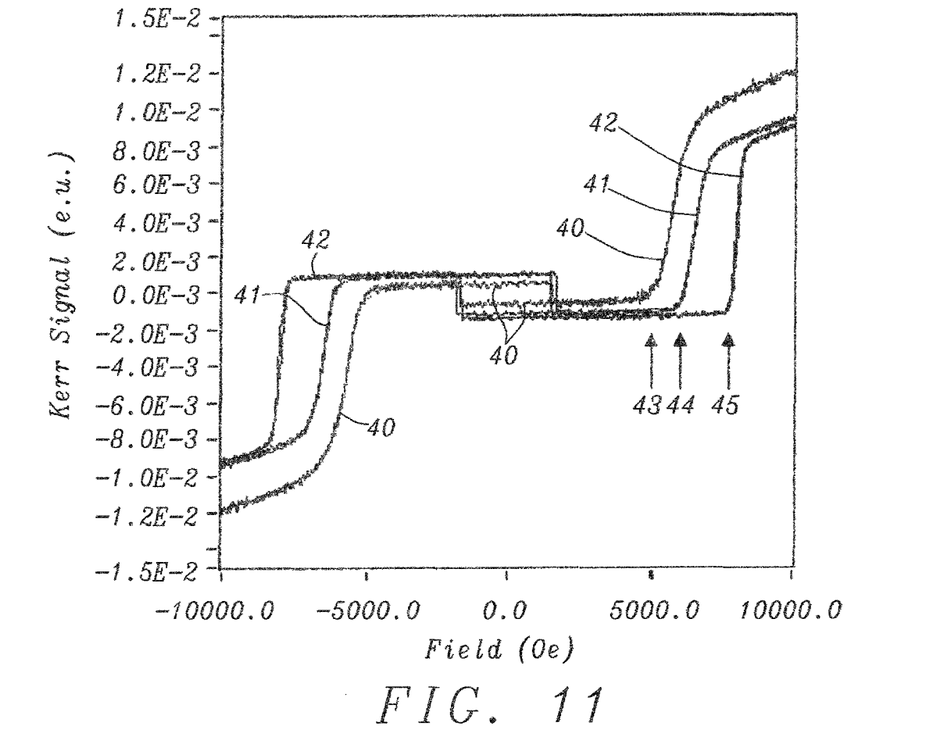
FIG. 11 is a plot of Kerr signal vs. PMA field for a reference layer when formed on various seed layers after a 360° C., 30 minute anneal.

To demonstrate the effect of the template layer on enhancing PMA in an overlying reference layer, a reference layer (RL) stack having a $(Ni6/Co1.8)_3/Co5/Ru4/Co5/Mo2/CoFeB9$ or AP2/DL1/Ru/DL2/L/AP1 configuration was formed on a seed layer where each number following an element in the RL is the thickness in Angstroms. The Ni/Co laminate is the AP2 layer, Co is used as DL1 and DL2 layers, Mo is a transition layer, and CoFeB is the AP1 layer. In rows 1-3 of Table 1, a $(Ni5/Ru1.5)_8$ laminate, a $(Ni5/Mo1)_8$ laminate, and a 50 Angstrom thick NiCr layer, respectfully, are employed as a seed (template) layer. Ru has a hexagonal close packed (HCP) crystal structure with good lattice matching between its <001> orientation and the FCC <111> texture in an overlying Ni layer in AP2. Mo has a body centered cubic (BCC) crystal structure with good lattice matching between its <011> orientation and the Ni FCC <111> texture in AP2. All seed layer/RL stacks were annealed for 30 minutes at 360° C. A plot of Kerr signal vs. perpendicular field in FIG. 11 shows a stronger field 45 of about 8000 Oe for a NiCr/RL curve 42 than for the $(Ni5/Ru1.5)_8$/RL curve 40 and the $(Ni5/Mo1)_8$/RL curve 41 that have a maximum field 43, 44, respectively, of about 5000 Oe and 6000 Oe.

Although NiCr is better suited to establishing stronger PMA in an overlying reference layer, Ni/X laminates are advantageously employed as smoothing effect components of a seed layer stack as explained earlier. Moreover, the X layers also serve as better diffusion blockers than NiCr for Ta or TaN that tend to migrate from the bottom electrode. By including both of a $(Ni/X)_m$ or $(M/NiX)_n$ laminate and a NiCr template layer in the seed layer stack, a combination of improved diffusion barrier, smoother template layer top surface, and maximum PMA enhancement in an overlying reference layer are achieved at an acceptable material cost compared with prior art seed layers. The seed layer stack of the embodiments described herein is formed by employing conventional processes and materials without any significant added cost and can readily be implemented in a manufacturing environment.

While this disclosure has been particularly shown and described with reference to, the preferred embodiment thereof, it will be understood by those skilled in the art that various changes in form and details may be made without departing from the spirit and scope of this disclosure.

We claim:

1. A seed layer stack in a magnetic tunnel junction (MTJ), comprising:
    (a) a laminate having a $(M/NiX)_n$ structure wherein n is a lamination number, comprising:
        (1) a plurality of "n" M layers wherein each M layer is made of a material with a first bond energy, and having a first surface with an "as deposited" first peak to peak roughness; and
        (2) a plurality of NiX layers wherein X is one of Mo, Ru, Nb, Zr, Rh, W, Os, Ir, and Hf, and each NiX layer has a second bond energy that is greater than the first bond energy such that deposition of a NiX layer on an underlying M layer results in resputtering of the underlying M layer to generate a second surface on the underlying M layer where the second surface has a second peak to peak roughness substantially less than the "as deposited" first peak to peak roughness, and the NiX layer formed on the second surface, the NiX layer has a third surface with the second peak to peak roughness; and
    (b) an uppermost NiCr layer that contacts a top surface of the laminate, the uppermost NiCr layer has a top surface with the second peak to peak roughness.

2. The seed layer stack of claim 1 wherein the MTJ is formed in a magnetic random access memory (MRAM) device, in a read head sensor, or in a spintronics device that is a spin torque oscillator (STO), a spin-torque transfer (STT) MRAM, or a microwave assisted magnetic recording (MAMR) device.

3. The seed layer stack of claim 1 wherein each of the M layers is one or more of Mg, Al, Si, C, B, Mn, Rb, Zn, and Ti.

4. The seed layer stack of claim 1 wherein the MTJ is further comprised of a ferromagnetic layer that contacts the top surface of the uppermost NiCr layer, and a tunnel barrier that contacts a top surface of the ferromagnetic layer, the uppermost NiCr layer has a <111> crystal structure that enhances perpendicular magnetic anisotropy (PMA) in the ferromagnetic layer that also has a <111> crystal structure.

5. The seed layer stack of claim 4 wherein the ferromagnetic layer is a reference layer that has a synthetic antiparallel (SyAP) structure having an AP2/Ru/AP1 configuration wherein the AP2 layer contacts the top surface of the uppermost NiCr layer, and the AP1 layer adjoins a bottom surface of the tunnel barrier.

6. The seed layer stack of claim 5 wherein the AP2 layer is one of $(Co/X)_k$ or $(X/Co)_k$ where X is Pt, Pd, Ni, NiCo, Ni/Pt, or NiFe, and k is from 2 to 30, and the AP1 layer is one or more of CoFeB, Co, CoB, FeB, and CoFe.

7. The seed layer stack of claim 4 wherein the ferromagnetic layer is a free layer.

8. The seed layer stack of claim 4 wherein the ferromagnetic layer is a reference layer that has a synthetic antiparallel (SyAP) structure having an AP2/DL1/Ru/DL2/L/AP1 configuration wherein the AP2 layer contacts the top surface of the uppermost NiCr layer, the AP1 layer adjoins a bottom surface of the tunnel barrier, DL1 and DL2 are dusting layers made of Co or CoFe, and L is a transition layer that is Mo.

9. The seed layer stack of claim 8 wherein the AP2 layer is one of $(Co/X)_k$ or $(X/Co)_k$ where X is Pt, Pd, Ni, NiCo, Ni/Pt, or NiFe, and k is from 2 to 30, and the AP1 layer is one or more of CoFeB, Co, CoB, FeB, and CoFe.

10. A seed layer stack in a magnetic tunnel junction (MTJ), comprising:
    (a) a laminate having a $(Ni/X)_m$ structure wherein n is a lamination number, comprising:
        (1) a plurality Ni layers wherein each Ni layer has a first bond energy, and a first surface with an "as deposited" first peak to peak roughness; and
        (2) a plurality of X layers wherein X is one of Mo, Ru, Nb, Zr, Rh, W, Os, Ir, and Hf, and each X layer has one or both of a second bond energy that is substantially greater than the first bond energy, and an atomic number substantially larger than the atomic number of Ni such that deposition of an X layer on an underlying Ni layer results in resputtering of the underlying Ni layer to generate a second surface on the underlying Ni layer where the second surface has a second peak to peak roughness substantially less than the "as deposited" first peak to peak roughness, and the X layer formed on the second surface, the X layer has a third surface with the second peak to peak roughness; and
    (b) an uppermost NiCr layer that contacts a top surface of the laminate, the uppermost NiCr layer has a top surface with the second peak to peak roughness.

11. The seed layer stack of claim 10 wherein the MTJ is formed in a magnetic random access memory (MRAM) device, in a read head sensor, or in a spintronics device that is a spin torque oscillator (STO), a spin-torque transfer (STT) MRAM, or a microwave assisted magnetic recording (MAMR) device.

12. The seed layer stack of claim 10 further comprising a bottom "M" seed layer that is made of one or more of Mg, Al, Si, C, B, Mn, Rb, Zn, and Ti to give a $M/(Ni/X)_m/NiCr$ configuration wherein m is from about 2 to 20.

13. The seed layer stack of claim 10 wherein the MTJ is further comprised of a ferromagnetic layer that contacts the top surface of the uppermost NiCr layer, and a tunnel barrier that contacts a top surface of the ferromagnetic layer, the uppermost NiCr layer has a <111> crystal structure that enhances perpendicular magnetic anisotropy (PMA) in the ferromagnetic layer that also has a <111> crystal structure.

14. The seed layer stack of claim 13 wherein the MTJ has a bottom spin valve configuration and the ferromagnetic layer is a reference layer that has a synthetic antiparallel (SyAP) structure having an AP2/Ru/AP1 configuration wherein the AP2 layer contacts the top surface of the uppermost NiCr layer, and the AP1 layer adjoins a bottom surface of the tunnel barrier.

15. The seed layer stack of claim 14 wherein the AP2 layer is one of $(Co/X)_k$ or $(X/Co)_k$ where X is Pt, Pd, Ni, NiCo, Ni/Pt, or NiFe, and k is from 2 to 30, and the AP1 layer is one or more of CoFeB, Co, CoB, FeB, and CoFe.

16. The seed layer stack of claim 13 wherein the MTJ has a top spin valve configuration wherein the ferromagnetic layer is a free layer.

17. The seed layer stack of claim 13 wherein the ferromagnetic layer is a reference layer that has a synthetic antiparallel (SyAP) structure having an AP2/DL1/Ru/DL2/L/AP1 configuration wherein the AP2 layer contacts the top surface of the uppermost NiCr layer, the AP1 layer adjoins a bottom surface of the tunnel barrier, DL1 and DL2 are dusting layers made of Co or CoFe, and L is a transition layer that is Mo.

18. The seed layer stack of claim 17 wherein the AP2 layer is one of $(Co/X)_k$ or $(X/Co)_k$ where X is Pt, Pd, Ni, NiCo, Ni/Pt, or NiFe, and k is from 2 to 30, and the AP1 layer is one or more of CoFeB, Co, CoB, FeB, and CoFe.

19. A method of forming a magnetic tunnel junction (MTJ), comprising:
  (a) forming a seed layer stack, comprising:
    (1) sputter depositing a first seed layer that is Ni with a first bond energy on a substrate, the first seed layer has a first surface with a first peak to peak roughness;
    (2) sputter depositing a second seed layer that is an X layer on the first seed layer wherein X is one of Mo, Ru, Nb, Zr, Rh, W, Os, Ir, and Hf, the X layer has one or both of a second bond energy that is greater than the first bond energy and an atomic number greater than that of Ni, and results in a second surface on the first seed layer with a second peak to peak roughness substantially less than the first peak to peak roughness, and the second seed layer formed on the second surface, the second seed layer has a third surface with the second peak to roughness;
    (3) repeating steps (1) and (2) in order one or more times to form a $(Ni/X)_m$ laminate where m is a lamination number; and
    (4) sputter depositing an uppermost NiCr seed layer on the $(Ni/X)_m$ laminate, the uppermost NiCr seed layer has a <111> crystal orientation with a top surface having the second peak to peak roughness, and promotes perpendicular magnetic anisotropy (PMA) in an overlying ferromagnetic layer; and
  (b) depositing the overlying ferromagnetic layer that contacts the top surface of the uppermost NiCr seed layer.

20. The method of claim 19 further comprised of annealing the MTJ including the seed layer stack and the ferromagnetic layer at a temperature of about 330° C. to 400° C.

21. The method of claim 19 wherein m is from 2 to 20.

22. The method of claim 19 wherein the ferromagnetic layer is a reference layer or a free layer, and the MTJ is formed in a magnetic random access memory (MRAM) device, in a read head sensor, or in a spintronics device that is a spin torque oscillator (STO), a spin-torque transfer (STT) MRAM, or a microwave assisted magnetic recording (MAMR) device.

23. The method of claim 19 wherein the ferromagnetic layer is a reference layer having a synthetic antiparallel (SyAP) structure with an AP2/Ru/AP1 configuration in which the uppermost NiCr layer contacts the AP2 layer and promotes perpendicular magnetic anisotropy (PMA) and a <111> crystal structure therein, and an overlying tunnel barrier contacts the AP1 layer and promotes PMA therein.

24. The method of claim 23 wherein the AP2 layer is one of $(Co/X)_k$ or $(X/Co)_k$ where X is Pt, Pd, Ni, NiCo, Ni/Pt, or NiFe, and k is from 2 to 30, and the AP1 layer is one or more of CoFeB, Co, CoB, FeB, and CoFe.

25. The method of claim 19 wherein the ferromagnetic layer is a reference layer having a synthetic antiparallel (SyAP) structure with an AP2/DL1/Ru/DL2/L/AP1 configuration wherein the AP2 layer contacts the top surface of the uppermost NiCr layer, the AP1 layer adjoins a bottom surface of a tunnel barrier, DL1 and DL2 are dusting layers made of Co or CoFe, and L is a transition layer that is Mo.

* * * * *